(12) United States Patent
Biagini et al.

(10) Patent No.: US 12,457,895 B2
(45) Date of Patent: Oct. 28, 2025

(54) SEMI-TRANSPARENT PEROVSKITE-BASED PHOTOVOLTAIC CELLS AND PROCESS FOR PREPARING THEM

(71) Applicant: ENI S.P.A., Rome (IT)

(72) Inventors: Paolo Biagini, Novara (IT); Riccardo Po', Novara (IT); Francesco Bisconti, Monteroni di Lecce (IT); Antonella Giuri, Salice Salentino (IT); Aurora Rizzo, Lecce (IT); Silvia Colella, Bari (IT)

(73) Assignee: ENI S.P.A., Rome (IT)

( * ) Notice: Subject to any disclaimer, the term of this patent is extended or adjusted under 35 U.S.C. 154(b) by 137 days.

(21) Appl. No.: 18/010,967

(22) PCT Filed: Jun. 16, 2021

(86) PCT No.: PCT/IB2021/055299
§ 371 (c)(1),
(2) Date: May 18, 2023

(87) PCT Pub. No.: WO2021/255657
PCT Pub. Date: Dec. 23, 2021

(65) Prior Publication Data
US 2023/0232705 A1    Jul. 20, 2023

(30) Foreign Application Priority Data
Jun. 17, 2020   (IT) .................. 102020000014470

(51) Int. Cl.
*H10K 85/50* (2023.01)
*C09K 11/02* (2006.01)
(Continued)

(52) U.S. Cl.
CPC ............ *H10K 85/50* (2023.02); *C09K 11/025* (2013.01); *H10K 30/82* (2023.02); *H10K 30/85* (2023.02);
(Continued)

(58) Field of Classification Search
CPC ............ H01L 31/022466; H10K 85/50; H10K 30/211; H10K 30/50; H10K 30/82;
(Continued)

(56) References Cited

U.S. PATENT DOCUMENTS

2017/0084399 A1*  3/2017  Vak ........................ H10K 85/30
2021/0193929 A1*  6/2021  Fujinuma ............... H10K 85/50

FOREIGN PATENT DOCUMENTS

CN          106058058 A        10/2016

OTHER PUBLICATIONS

Aharon S. at al., in "Advanced Materials Interfaces" (2015), vol. 2, https://doi.org/10.1002/admi.201500118.
(Continued)

*Primary Examiner* — Mayla Gonzalez Ramos
(74) *Attorney, Agent, or Firm* — CANTOR COLBURN LLP (57) ABSTRACT

A semi-transparent perovskite-based photovoltaic cell (or solar cell), wherein the photoactive perovskite layer includes at least one polysaccharide-based inert polymer in an amount ranging between 0.5% by weight and 3.5% by weight, preferably ranging between 1% by weight and 3% by weight, more preferably ranging between 1.5% by weight and 2.8% by weight, with respect to the total weight of the perovskite precursors. The semi-transparent perovskite-based photovoltaic cell (or solar cell) can be advantageously used in various applications that require the production of electricity through the exploitation of light energy, in particular solar radiation energy such as, for example: building (Continued)

integrated photovoltaic (BIPV) systems; photovoltaic windows; greenhouses; photo-bioreactors; noise barriers; lighting; design; advertising; automotive industry. Said semi-transparent perovskite-based photovoltaic cell (or solar cell) can be used either in a "stand alone" mode or in modular systems.

8 Claims, 1 Drawing Sheet (51) Int. Cl.
  *H10K 30/20*  (2023.01)
  *H10K 30/50*  (2023.01)
  *H10K 30/82*  (2023.01)
  *H10K 30/85*  (2023.01)
  *H10K 30/86*  (2023.01)
  *H10K 50/15*  (2023.01)
  *H10K 102/10*  (2023.01)

(52) U.S. Cl.
  CPC ............. *H10K 30/86* (2023.02); *H10K 50/15* (2023.02); *H10K 30/50* (2023.02); *H10K 2102/103* (2023.02)

(58) Field of Classification Search
  CPC ........ H10K 30/85; H10K 30/86; H10K 50/15; H10K 2102/103; C09K 11/025
  See application file for complete search history.

(56) References Cited

OTHER PUBLICATIONS

Aharon S. at al., in "Advanced Materials Interfaces" (2015), vol. 2, https://doi.org/10.1002/admi.201500118; Abstract Only (1 page).
Anonymous: "Absorbance—Wikipedia", Jan. 21, 2008, Retrieved from the Internet: URL:https://en.wikipedia.org/wiki/Absorbance [retrieved on Sep. 2, 2021]; 8 pages.
Bag S. at al., in "Nano Energy" (2016), vol. 30, pp. 542-548.
Chang C.-Y. et al., in "Chemistry of Materials" (2015), vol. 27, pp. 7119-7127.
Cho S.-P. at al., in "Solar Energy Materials and Solar Cells" (2019), vol. 196, pp. 1-8.
Chu H.-Y. at al., in "Cellulose" (2019), DOI:10.1007/s10570-019-02724-2.
Chu Hsiang-Yi et al: "Enhanced photovoltaic properties of perovskite solar cells by the addition of cellulose derivatives to MAPblbased photoactive layer", Cellulose, Springer Netherlands, Netherlands, vol. 26, No. 17, Sep. 4, 2019, pp. 9229-9239.
Eperon G. E. at al., in "ACS Nano" (2014), vol. 8, Issue 1, pp. 591-598.
He J. at al., in "ChemPlusChem" (2016), vol. 18, Issue 12, pp. 1292-1298.
International Search Report; International Application No. PCT/IB2021/055299; International Filing Date Jun. 16, 2021; 4 pages.
Jung J. W. at al., in "Advanced Energy Materials" (2015), vol. 5, Issue 17, 1500486.
Kwon H.-C. et al., in "Advanced Energy Materials" (2016), vol. 6, Issue 20, 1601055.
Stav Rahmany and Lioz Etgar: "Semitransparent Perovskite Solar Cells", ACS Energy Lett., vol. 5, Apr. 6, 2020, pp. 1519-1531.
Written Opinion of the International Searching Authority; International Application No. PCT/IB2021/055299; International Filing Date Jun. 16, 2021; 8 pages.
Xue Q et al., in "Advanced Energy Materials" (2017), vol. 7, Issue 9, 1602333.
Yang J. at al., in "Applied Materials & Interfaces" (2019), vol. 11, Issue 14, pp. 13491-13498.
Zhao Yicheng et al: "A polymer scaffold for self-healing perovskite solar cells", Nature Communications, vol. 7, No. 1, Jan. 6, 2016, 10 pages.
Zuo L. at al., in "Advanced Materials" (2019), vol. 31, Issue 36, 1901683.
United Arab Emirates Office Action for Application No. P6002685/2022, dated Nov. 26, 2024, 8 pages.

* cited by examiner

SEMI-TRANSPARENT PEROVSKITE-BASED PHOTOVOLTAIC CELLS AND PROCESS FOR PREPARING THEM

TECHNICAL FIELD

The present disclosure relates to semi-transparent perovskite-based photovoltaic cells (or solar cells).

More particularly, the present disclosure relates to a semi-transparent perovskite-based photovoltaic cell (or solar cell), wherein the photoactive perovskite layer comprises at least one polysaccharide-based inert polymer in an amount ranging between 0.5% by weight and 3.5% by weight, preferably ranging between 1% by weight and 3% by weight, more preferably ranging between 1.5% by weight and 2.8% by weight, with respect to the total weight of the perovskite precursors.

Said semi-transparent perovskite-based photovoltaic cell (or solar cell) can be advantageously used in various applications that require the production of electricity through the exploitation of light energy, in particular solar radiation energy such as, for example: building integrated photovoltaic (BIPV) systems; photovoltaic windows; greenhouses; photo-bioreactors; noise barriers; lighting; design; advertising; automotive industry. Said semi-transparent perovskite-based photovoltaic cell (or solar cell) can be used either in a "stand alone" mode or in modular systems.

The present disclosure also relates to a process for preparing said semi-transparent perovskite-based photovoltaic cell (or solar cell).

BACKGROUND

It is well known that photovoltaic cells (or solar cells) can be used in various applications that require the production of electricity through the exploitation of light energy such as, for example, in building integrated photovoltaic (BIPV) systems such as, for example, in facades, or on roofs, in greenhouses, or even in the automotive industry to cover vehicles of various sizes, characteristics and uses.

In contrast to conventional photovoltaic cells (or solar cells), where most efforts are devoted to optimizing the power conversion efficiency (PCE), in semi-transparent photovoltaic cells (or solar cells), transparency in the visible region ["Average Visible Transmittance" (AVT)] must also be taken into account, which is typically calculated as the percentage of the radiation measured in the range between 400 nm and 800 nm that passes through said semi-transparent photovoltaic cells (or solar cells) unaltered.

In addition, in said semi-transparent photovoltaic cells (or solar cells) another parameter is taken into account, i.e. the light conversion efficiency ["Light Utilization Efficiency"—(LUE)] which is calculated according to the following formula:

$$LUE = (PCE \times AVT)/100$$

wherein:
PCE=Power Conversion Efficiency;
AVT=transparency in the visible region ("Average Visible Transmittance").

Obviously, high values of light conversion efficiency ["Light Utilization Efficiency" (LUE)] can be obtained either by using high-performance photovoltaic cells (or solar cells), i.e. with high power conversion efficiency (PCE) but with low transparency, i.e. having low transparency in the visible region ["Average Visible Transmittance" (AVT)], or using low-performance photovoltaic cells (or solar cells), i.e. having low-performance power conversion efficiency (PCE) but with high transparency, i.e. having high transparency in the visible region ["Average Visible Transmittance" (AVT)]. Therefore, photovoltaic cells (or solar cells) that may have a real practical interest must have a light conversion efficiency ["Light Utilization Efficiency"—(LUE)]>2% obtained with a power conversion efficiency (PCE)>10% and a simultaneous transparency in the visible region ["Average Visible Transmittance"—(AVT)]>20%.

Finally, a further parameter that must be considered, and that concerns both traditional photovoltaic cells (or solar cells) and semi-transparent ones, is the simplicity of the construction process, which in perspective may allow a scaling up of the technology at lower costs.

Currently, most of the photovoltaic cells (or solar cells) available on the market are silicon-based (both crystalline and amorphous). However, these photovoltaic cells (or solar cells), while providing interesting performance, are not very attractive from an aesthetic point of view because it is not possible to modulate their colour and, consequently, are not suitable for use in photovoltaic systems architecturally integrated ("Building Integrated Photo Voltaic"—BIPV), in particular in the facades of buildings.

Some of the above problems can be overcome by using semi-transparent photovoltaic cells (or solar cells) based on organic polymers (OPV), or on crystalline perovskite based materials (PSC). In particular, with this last type of photovoltaic cells (or solar cells) it is possible to choose the colour and maintain interesting properties both in terms of power conversion efficiency (PCE), and in terms of transparency in the visible region ["Average Visible Transmittance"—(AVT)]. For this reason, in recent years, many studies have been done in order to optimize both the power conversion efficiency (PCE), and the transparency in the visible region ["Average Visible Transmittance"—(AVT)], in semi-transparent perovskite-based photovoltaic cells (or solar cells).

For example, Eperon G. E. at al., in "*ACS Nano*" (2014), Vol. 8, Issue 1, pages 591-598, report the manufacture of semi-transparent perovskite-based solar cells with the following layout c-TiO$_2$/perovskite([CH$_3$NH$_3$]I+PbCl$_2$; 3:1)/Spiro-OMeTAD/Au, obtaining with one particular configuration a power conversion efficiency (PCE) equal to 3.5% and a transparency in the visible region ["Average Visible Transmittance"—(AVT)] equal to 26.8%, whereas with another configuration, a power conversion efficiency (PCE) equal to 6.9% and a transparency in the visible region ["Average Visible Transmittance" (AVT)] equal to 9.7%. However, it is believed that the construction process may be very complicated and hardly suitable for use in the scaling up phase for the construction of large area semi-transparent photovoltaic cells (or solar cells), as it involves an annealing step at 500° C. to obtain the compact layer c-TiO$_2$ and furthermore the authors obtain the semi-transparency of the various devices prepared by deposition of the active layer of perovskite in zones, that is, within the active area there is an alternation of zones in which the perovskite material is present to zones in which it is not present. This particular configuration is achieved by adjusting all the deposition parameters in a very precise way: a non-stoichiometric ratio between the components of the perovskite ([CH$_3$NH$_3$]I/PbCl$_2$) is used, the vapour pressure of the liquid phase is varied using various solvents (dimethyl sulfoxide, dimethylformamide, N-methylpyrrolidone), the annealing temperature is varied (90° C.-130° C.) and the oxygen content and humidity present in the annealing atmosphere are varied.

Aharon S. at al., in "*Advanced Materials Interfaces*" (2015), Vol. 2, https://doi.org/10.1002/admi.201500118, report the manufacture of semi-transparent perovskite-based solar cells having the following layout: c-TiO$_2$/meso-TiO$_2$/CH$_3$NH$_3$PbI$_3$/Spiro-OMeTAD/Au, obtaining as best result, a power conversion efficiency (PCE) equal to 4.98% and a transparency in the visible region ["Average Visible Transmittance"—(AVT)] equal to 19%. Also in this case it is believed that the construction process can be very complicated and hardly suitable for use in the scaling up phase for the construction of large area semi-transparent photovoltaic cells (or solar cells), as it involves three annealing steps at 450° C.-500° C. to obtain the layers of c-TiO$_2$ and meso-TiO$_2$, in addition, the semi-transparency is obtained and regulated by means of the deposition by screen printing of the active perovskite-based layer through a grid of variable size and by controlling the concentration of the solutions of precursors, the speed of evaporation of the solvent, the addition of components to modify the wettability and environmental humidity.

Jung J. W. at al., in "*Advanced Energy Materials*" (2015), Vol. 5, Issue 17, 1500486, report the manufacture of semi-transparent perovskite-based solar cells having the following layout: CuSCN/CH$_3$NH$_3$PbI$_3$/PCBM/Ag, obtaining a power conversion efficiency (PCE) around 10% and a transparency in the visible region ["Average Visible Transmittance"—(AVT)] greater than or equal to 25%. However, the transparency in the visible region ["Average Visible Transmittance" (AVT)] is certainly overestimated as the authors measure it in the range between 300 nm and 850 nm. In addition, the photoactive perovskite layer (CH$_3$NH$_3$PbI$_3$) was deposited by means of a process involving the addition of an anti-solvent (i.e., toluene) to regulate crystal growth. Said process is not easy to implement on a laboratory scale and can be a source of considerable irreproducibility of the results and, in addition, it is considered that it is not suitable to be used in the scaling up phase for the construction of large area semi-transparent photovoltaic cells (solar cells).

Chang C.-Y. et al., in "*Chemistry of Materials*" (2015), Vol. 27, pages 7119-7127, report the manufacture of semi-transparent perovskite-based solar cells having the following layout: PEDOT:PSS/CH$_3$NH$_3$PbI$_3$/PC$_{61}$BM/Ag using a special cathodic buffer layer based on alkyl ammonium salts modified with thiol groups and using an ultrathin silver layer as electrode, obtaining a power conversion efficiency (PCE) equal to 11.8% and a transparency in the visible region ["Average Visible Transmittance"—(AVT)] equal to 20.8% (measured in the range between 350 nm and 800 nm). The photoactive perovskite layer was obtained by a two-steps process wherein a first layer of a solution of lead iodide (PbI$_2$) in dimethylformamide (DMF), followed by a second layer of a solution of methylammonium iodide [(CH$_3$NH$_3$)I] in dimethylformamide (DMF) were deposited. Again, it is believed that the process of obtaining the photoactive perovskite layer may be a source of irreproducibility and hardly suitable for use in scaling up phase for the construction of large area semi-transparent photovoltaic cells (or solar cells).

Kwon H.-C. et al., in "*Advanced Energy Materials*" (2016), Vol. 6, Issue 20, 1601055, report the manufacture of semi-transparent perovskite-based solar cells having the following layout: PEDOT:PSS/CH$_3$NH$_3$PbI$_3$/PC$_{61}$BM/Ag ct:c-TiO$_2$/AAO+perovskite([CH$_3$NH$_3$]I+PbCl$_2$; 3:1)/Spiro-OMeTAD/MoO$_x$-ITO obtaining a power conversion efficiency (PCE) equal to 9.6% and a transparency in the visible region ["Average Visible Transmittance"—(AVT)] equal to 33.4% (measured in the range between 350 nm and 900 nm). Also in this case, it is believed that the construction process can be very complicated and hardly suitable for use in the scaling up phase for the construction of large area semi-transparent photovoltaic cells (solar cells), as it involves an annealing step at 500° C. to obtain the compact layer c-TiO$_2$, a subsequent evaporation of aluminium that must be subjected to an anodizing process that leads to the formation of an aluminium oxide template having pores of controlled size (AAO) inside which a photoactive perovskite layer is introduced. Moreover, the transparency value in the visible region ["Average Visible Transmittance"—(AVT)] seems to be quite overestimated considering the width of the range in which it was measured.

Bag S. at al., in "*Nano Energy*" (2016), Vol. 30, pages 542-548, report the manufacture of semi-transparent perovskite-based solar cells having the following layout: PEDOT:PSS/CH$_3$NH$_3$PbI$_3$/PC$_{71}$BM/Ag obtaining a power conversion efficiency (PCE) equal to 8.2% and a transparency in the visible region ["Average Visible Transmittance"—(AVT)] equal to 34% (measured in the range between 400 nm and 800 nm). Also in this case, it is believed that the construction process involving the deposition of the photoactive perovskite layer in two steps and, in addition, in order to achieve the described performance, the evaporative deposition of a very thin layer (about 5 nm) of thiourea on the layer of the PEDOT:PSS layer and of a very thin layer of fullerene (C$_{60}$) on the PC$_{71}$BM layer, may be very complicated and hardly suitable for use in the scaling up phase for the construction of large area semi-transparent photovoltaic cells (or solar cells).

Xue Q. et al., in "*Advanced Energy Materials*" (2017), Vol. 7, Issue 9, 1602333, report the manufacture of semi-transparent perovskite-based solar cells having the following layout: NiO-DEA/CH$_3$NH$_3$PbI$_3$/C$_{60}$CH$_2$Ind/PN$_4$N/Ag, obtaining a power conversion efficiency (PCE) equal to 11% and a transparency in the visible region ["Average Visible Transmittance"—(AVT)] equal to 25.6% (measured in the range between 380 nm and 780 nm). Also in this case, it is believed that the construction process involving the deposition of the photoactive perovskite layer in two steps with the addition of an anti-solvent (i.e. toluene) and, moreover, in order to obtain the described performances, the deposition of a very thin monomolecular diethylamine (DEA) layer on the NiO layer, said NiO layer being obtained by annealing at 500° C. and of a very thin layer of a polymer functionalized with an amine group (PN$_4$N) (5 nm) on the C$_{60}$CH$_2$Ind layer, can be very complicated and hardly suitable for use in scaling up phase for the construction of large area semi-transparent photovoltaic cells (solar cells).

Cho S.-P. at al., in "*Solar Energy Materials and Solar Cells*" (2019), Vol. 196, pages 1-8, report the manufacture of semi-transparent perovskite-based solar cells having the following layout: NiO/CH$_3$NH$_3$PbI$_3$/PCBM/PEIE/Cu, obtaining a power conversion efficiency (PCE) equal to 8.2% and a transparency in the visible region ["Average Visible Transmittance"—(AVT)] equal to 22% (measured in the range between 300 nm and 1000 nm and, therefore, overestimated). However, although the construction process involves the deposition of the photoactive perovskite layer in a single step using 2-methoxy ethanol as a solvent, since the NiO layer is obtained by annealing at 350° C., it is hardly suitable for use in the scaling up phase for the construction of large-area semi-transparent photovoltaic cells (or solar cells).

Zuo L. at al., in "*Advanced Materials*" (2019), Vol. 31, Issue 36, 1901683, report the manufacture of semi-transparent perovskite-based solar cells having the following layout: NiO/PSS/FAPbBrxCl$_3$-x/PC$_{61}$BM/ZnO$_{np}$/ITO$_{sputtered}$, obtaining a power conversion efficiency (PCE) equal to 7.5% and a transparency in the visible region ["Average Visible Transmittance"—(AVT)] equal to about 68% (measured in the range between 350 nm and 1000 nm and, therefore, overestimated). Also in this case, it is believed that the construction process involving the deposition of the photoactive perovskite layer in two steps and the deposition of ITO, as a counter-electrode, by sputtering is hardly suitable for use in the scaling up phase for the construction of large area semi-transparent photovoltaic cells (or solar cells).

It is also known, to add cellulose-based polymers to the photoactive perovskite layer of perovskite-based photovoltaic cells (or solar cells).

For example, He J. at al., in "ChemPlusChem" (2016), Vol. 18, Issue 12, pages 1292-1298, report an improvement in the humidity and light stability of perovskite-based solar cells (i.e. $CH_3NH_3PbI_3$) by addition of ethyl cellulose to the photoactive perovskite layer, in an amount equal to 25 mg/ml which corresponds to about 3.7% by weight with respect to the total weight of the perovskite precursors, obtaining a power conversion efficiency (PCE) equal to 14.8%. However, the overall construction process and, in particular, that of the photoactive perovskite layer, which involves the presence of a large excess of ammonium salt compared to lead salt (3:1 mol:mol), does not allow to obtain a semi-transparent solar cell, which is not even taken into account by the authors. In addition, the construction of the solar cells described therein, which involves the deposition of a compact layer of titanium dioxide ($TiO_2$) that requires an annealing temperature of 500° C., makes this type of solar cell difficult to scale in a process for the production of large area photovoltaic cells (or solar cells).

Yang J. at al., in "Applied Materials & Interfaces" (2019), Vol. 11, Issue 14, pages 13491-13498, report perovskite-based solar cells (i.e. $CH_3NH_3PbI_3$) comprising ethyl cellulose in the photoactive perovskite layer, in amounts equal to 0.01 mg/ml, 0.1 mg/ml and 1 mg/ml which corresponds to a maximum of about 0.16% by weight with respect to the total weight of the perovskite precursors, obtaining a power conversion efficiency (PCE) of up to 19.27%. In this case, it is believed that the construction process that involves the deposition of the photoactive perovskite layer in two steps and the addition of an anti-solvent (i.e. chlorobenzene) and the deposition of a compact layer of titanium dioxide ($TiO_2$) that requires an annealing temperature of 500° C. is hardly suitable for use in scaling up phase for the construction of large area photovoltaic cells (or solar cells). Furthermore, no mention of transparency in the visible region ["Average Visible Transmittance"—(AVT)] is made.

Chu H.-Y. at al., in "Cellulose" (2019), DOI:10.1007/s10570-019-02724-2, report perovskite-based solar cells (i.e. $CH_3NH_3PbI_3$) comprising chlorodeoxyhydroxyethylcellulose (CDHC) in the perovskite photoactive layer, in amounts equal to 0.3 mg/ml, 0.6 mg/ml and 1.2 mg/ml which corresponds to a maximum of about 0.16% by weight with respect to the total weight of the perovskite precursors, obtaining a power conversion efficiency (PCE) equal to 10.38%. The construction process involves the deposition of the photoactive perovskite layer comprising chlorodeoxyhydroxyethylcellulose (CDHC) in one step but no mention of the transparency in the visible region ["Average Visible Transmittance"—(AVT)] is made.

SUMMARY

It is therefore clear from the foregoing that it is important to have a semi-transparent perovskite-based photovoltaic cell (or solar cell), as well as a process for its construction suitable for use in the scaling up phase for the construction of large area semi-transparent photovoltaic cells (or solar cells).

The Applicant has therefore set itself the problem of finding a semi-transparent perovskite-based photovoltaic cell (or solar cell) capable of having both good power conversion efficiency (PCE) and good transparency in the visible region ["Average Visible Transmittance"—(AVT)] (measured, in the range between 400 nm and 800 nm), as well as a process for its construction suitable to be used in the scaling up phase for the construction of large area semi-transparent photovoltaic cells (solar cells).

The Applicant has now found a semi-transparent perovskite-based photovoltaic cell (or solar cell) in which the photoactive perovskite layer comprises at least one polysaccharide-based inert polymer in an amount ranging between 0.5% by weight and 3.5% by weight, preferably ranging between 1% by weight and 3% by weight, more preferably ranging between 1.5% by weight and 2.8% by weight, with respect to the total weight of the perovskite precursors, capable of having both good power conversion efficiency (PCE) (i.e. PCE>10%), and a good transparency in the visible region ["Average Visible Transmittance"—(AVT)] (i.e. AVT>20%) (measured in the range between 400 nm and 800 nm), as well as a process for its construction that involves the deposition of the photoactive perovskite layer in a single step without using an anti-solvent, and is therefore suitable for use in a scaling up phase for the construction of large area photovoltaic cells (or solar cells). In addition, said semi-transparent perovskite-based photovoltaic cell (or solar cell) is able to maintain good photoelectric properties, i.e. good values of FF ("Fill Factor"), Voc ("Open Circuit Voltage"), Jsc ("short-circuit photocurrent density"). Said semi-transparent perovskite-based photovoltaic cell (or solar cell) can be advantageously used in various applications that require the production of electricity through the exploitation of light energy, in particular solar radiation energy such as, for example: building integrated photovoltaic (BIPV) systems; photovoltaic windows; greenhouses; photo-bioreactors; noise barriers; lighting; design; advertising; automotive industry. Furthermore, said semi-transparent perovskite-based photovoltaic cell (or solar cell) can be used either in a "stand alone" mode or in modular systems.

Accordingly, the present disclosure provides a semi-transparent perovskite-based photovoltaic cell (or solar cell) wherein the photoactive perovskite layer comprises at least one polysaccharide-based inert polymer in an amount ranging between 0.5% by weight and 3.5% by weight, preferably ranging between 1% by weight and 3% by weight, more preferably ranging between 1.5% by weight and 2.8% by weight, with respect to the total weight of the perovskite precursors, said polysaccharide-based inert polymer being selected from methylcellulose, 2-hydroxyethyl cellulose (HEC), methyl-2-hydroxyethyl cellulose, hydroxypropyl methyl cellulose, cellulose acetate phthalate, cellulose propionate, corn starch, potato starch, rice starch, 2-hydroxyethyl starch, carboxymethyl starch, glycogen.

For the purpose of the present description and the following claims, the definitions of the numerical intervals always comprise the extreme values unless otherwise specified.

For the purpose of the present description and the following claims, the term "comprising" also includes the terms "which essentially consists of" or "which consists of".

In accordance with a preferred embodiment of the present disclosure, said perovskite may be selected, for example, from organometallic trihalides having general formula ABX$_3$ wherein:

- A represents a monovalent organic cation such as for example methylammonium (CH$_3$NH$_3^+$), formamidinium [CH(NH$_2$)$_2^+$], n-butylammonium (C$_4$H$_{12}$NH$_3^+$), tetra-butylammonium (C$_{16}$H$_{36}$N$^+$), or mixtures thereof or A represents a monovalent inorganic cation such as for example caesium (Cs$^+$), rubidium (Rb$^+$), potassium (K), lithium (Li$^+$), sodium (Na$^+$), copper (Cu$^+$), silver (Ag$^+$), or mixtures thereof; or mixtures thereof;
- B represents a divalent metallic cation such as for example lead (Pb$^{2+}$), tin (Sn$^{2+}$), or mixtures thereof;
- X represents a halide anion such as for example iodine (I$^-$), chlorine (Cl$^-$), bromine (Br$^-$), or mixtures thereof.

In accordance with a further preferred embodiment of the present disclosure, said perovskite may be selected, for example, from: methylammonium lead iodide (CH$_3$NH$_3$PbI$_3$), methylammonium lead bromide (CH$_3$NH$_3$PbBr$_3$), methylammonium lead chloride (CH$_3$NH$_3$PbCl$_3$), methylammonium lead iodide bromide (CH$_3$NH$_3$PbI$_x$Br$_{3-x}$), methylammonium lead iodide chloride (CH$_3$NH$_3$PbI$_x$Cl$_{3-x}$), formamidinium lead iodide [CH(NH$_2$)$_2$PbI$_3$], formamidinium lead bromide [CH(NH$_2$)$_2$PbBr$_3$], formamidinium lead chloride [CH(NH$_2$)$_2$PbCl$_3$], formamidinium lead iodide bromide [CH(NH$_2$)$_2$PbI$_x$Br$_{3-x}$], formamidinium lead iodide chloride [CH(NH$_2$)$_2$PbI$_x$Cl$_{3-x}$], methylammonium formamidinium lead iodide [(CH$_3$NH$_3$)$_x$(CH(NH$_2$)$_2$)$_{1-x}$PbI$_{3-x}$], methylammonium formamidinium lead bromide [(CH$_3$NH$_3$)$_x$(CH(NH$_2$)$_2$)$_{1-x}$PbBr$_3$], methylammonium formamidinium lead chloride [(CH$_3$NH$_3$)$_x$(CH(NH$_2$)$_2$)$_{1-x}$PbCl$_3$], methylammonium formamidinium lead iodide chloride [(CH$_3$NH$_3$)$_x$(CH(NH$_2$)$_2$)$_{1-x}$PbI$_{3-y}$Cl$_y$], methylammonium formamidinium lead iodide bromide [(CH$_3$NH$_3$)$_x$(CH(NH$_2$)$_2$)$_{1-x}$PbI$_{3-y}$Br$_y$], n-butylammonium lead iodide (C$_4$H$_{12}$NH$_3$PbI$_3$), tetra-butylammonium lead iodide (C$_{16}$H$_{36}$NPbI$_3$), n-butylammonium lead bromide (C$_4$H$_{12}$NH$_3$PbBr$_3$), tetra-butylammonium lead bromide (C$_{16}$H$_{36}$NPbBr$_3$), caesium lead iodide (CsPbI$_3$), rubidium lead iodide (RbPbI$_3$), potassium lead iodide (KPbI$_3$), caesium methylammonium lead iodide [Cs$_x$(CH$_3$NH$_3$)$_{1-x}$PbI$_3$], potassium methylammonium lead iodide [K$_x$(CH$_3$NH$_3$)$_{1-x}$PbI$_3$], caesium methylammonium lead iodide chloride [Cs$_x$(CH$_3$NH$_3$)$_{1-x}$PbI$_{3-y}$Cl$_y$], caesium formamidinium lead iodide [Cs$_x$(CH(NH$_2$)$_2$)$_{1-x}$PbI$_3$], caesium formamidinium lead bromide [Cs$_x$(CH(NH$_2$)$_2$)$_{1-x}$PbBr$_3$], caesium formamidinium lead iodide chloride [Cs$_x$(CH(NH$_2$)$_2$)$_{1-x}$PbI$_{3-y}$Cl$_y$], methylammonium tin iodide (CH$_3$NH$_3$SnI$_3$), methylammonium tin bromide (CH$_3$NH$_3$SnBr$_3$), methylammonium tin iodide bromide (CH$_3$NH$_3$SnI$_x$Br$_{3-x}$), formamidinium tin iodide [CH(NH$_2$)$_2$SnI$_3$], formamidinium tin iodide bromide [CH(NH$_2$)$_2$SnI$_x$Br$_{3-x}$], n-butylammonium tin iodide (C$_4$H$_{12}$NH$_3$SnI$_3$), tetra-butylammonium tin iodide (C$_{16}$H$_{36}$NSnI$_3$), n-butylammonium tin bromide (C$_4$H$_{12}$NH$_3$SnBr$_3$), tetra-butylammonium tin bromide (C$_{16}$H$_{36}$NSnBr$_3$), methylammonium tin lead iodide (CH$_3$NH$_3$Sn$_x$Pb$_{1-x}$I$_3$), formamidinium tin lead iodide [CH(NH$_2$)$_2$Sn$_x$Pb$_{1-x}$I$_3$], or mixtures thereof. Methylammonium lead iodide (CH$_3$NH$_3$PbI$_3$), formamidinium lead iodide [CH(NH$_2$)$_2$PbI$_3$], methylammonium formamidinium lead iodide chloride [(CH$_3$NH$_3$)$_x$(CH(NH$_2$)$_2$)$_{1-x}$PbI$_{3-y}$Cl$_y$], caesium methylammonium lead iodide chloride [Cs$_x$(CH$_3$NH$_3$)$_{1-x}$PbI$_{3-y}$Cl$_y$], caesium formamidinium lead iodide chloride [Cs$_x$(CH(NH$_2$)$_2$)$_{1-x}$PbI$_{3-y}$Cl$_y$], are preferred. Methylammonium lead iodide (CH$_3$NH$_3$PbI$_3$) is even more preferred.

In accordance with a preferred embodiment of the present disclosure, said polysaccharide-based inert polymer may be selected from 2-hydroxyethyl cellulose (HEC), cellulose acetate phthalate, corn starch. 2-Hydroxyethyl cellulose (HEC) is more preferred.

In accordance with a preferred embodiment of the present disclosure, said semi-transparent perovskite-based photovoltaic cell (or solar cell) comprises:

- a glass substrate covered with a layer of transparent and conductive oxide (TCO), commonly fluorine-doped tin oxide (SnO$_2$:F) (FTO), or indium tin oxide (ITO) which constitutes the anode;
- a layer based on a hole transport material ("Hole Transport Layer"—HTL), preferably a layer of poly[bis(4-phenyl(2,4,6-trimethylphenyl)amine (PTAA), or a layer of poly[bis(4-butylphenyl)bisphenylbenzidine] (Poly-TPD), or a layer of a mixture of poly(3,4-ethylenedioxythiophene) and polystyrene sulfonate (PEDOT:PSS);
- optionally, a layer based on a material to improve the wettability, preferably a layer of poly(9,9-bis(3'-(N,N-dimethyl)-N-ethylammonium-propyl-2,7-fluorene)-alt-2,7-(9,9-dioctylfluorene))dibromide (PFN-Br);
- a photoactive layer comprising at least one perovskite, preferably methylammonium lead iodide (CH$_3$NH$_3$PbI$_3$) [methylammonium lead iodide (CH$_3$NH$_3$PbI$_3$) is the most widely used structure because it has a high absorption coefficient across the UV and visible spectrum, a band-gap equal to 1.57 eV, close to the optimum value to maximize conversion efficiency and a considerable electron and electron gap (or hole) scattering distance (over 100 nm)], and at least one inert polymer based on cellulose or starch, preferably 2-hydroxyethyl cellulose (HEC);
- a layer based on an electron transport material ("Electron Transport Layer"—ETL), preferably a layer of methyl ester of the [6,6]-phenyl-C$_{61}$-butyric acid (PC$_{61}$BM);
- optionally, a layer based on a hole blocking material ("Hole Blocking Layer"—HBL), preferably a layer of 2,9-dimethyl-4,7-diphenyl-1,10-phenanthroline (Bathocuproine—BCP) or ethoxylated polyethylenimine (PEIE);
- a metallic contact known as "back contact" which constitutes the cathode, preferably a gold, silver, or metallic aluminium layer.

In accordance with a preferred embodiment of the present disclosure, the electrical energy generated by said at least one semi-transparent perovskite-based photovoltaic cell (or solar cell) may be transported using a wiring system which is connected with said semi-transparent perovskite-based photovoltaic cell (or solar cell).

As mentioned above, the present disclosure provides a process for preparing said semi-transparent perovskite-based photovoltaic cell (or solar cell).

Accordingly, the present disclosure further provides a process for preparing a semi-transparent perovskite-based photovoltaic cell (or solar cell) comprising the following steps:

(a) preparing a glass substrate covered with a layer of transparent and conductive oxide (TCO) (anode);

(b) depositing a layer based on a hole transport material ("Hole Transport Layer"—HTL) on the substrate obtained in said step (a);

(c) optionally, depositing on the layer based on a hole transport material ("Hole Transport Layer"—HTL) obtained in said step (b) a layer based on a material to improve the wettability;

(d) preparing a mixture comprising perovskite precursors and at least one inert polymer based on cellulose or starch, said inert polymer being used in an amount ranging between 0.5% by weight and 3.5% by weight, preferably ranging between 1% by weight and 3% by weight, more preferably ranging between 1.5% by weight and 2.8% by weight, with respect to the total weight of the perovskite precursors;

(e) depositing the mixture obtained in said step (d) on the layer based on a hole transport material ("Hole Transport Layer"—HTL) obtained in said step (b), or on the layer based on a material to improve the wettability obtained in said step (c), obtaining a photoactive layer;

(f) depositing a layer based on an electron transport material ("Electron Transport Layer"—ETL), on the photoactive layer obtained in said step (e);

(g) optionally, depositing on the layer based on an electron transport material ("Electron Transport Layer"—ETL) obtained in said step (f), a layer based on a hole blocking material ("Hole Blocking Layer"—HBL);

(h) depositing a metallic contact known as "back contact" which constitutes the cathode, on the layer based on an electron transport material ("Electron Transport Layer"—ETL) obtained in said step (f), or on the layer based on a hole blocking material ("Hole Blocking Layer"—HBL) obtained in said step (g);

wherein said steps (b), (c), (e), (f) and (g), are carried out at a temperature lower than 120° C., preferably ranging between 20° C. and 110° C.

For the purpose of the aforesaid process, said transparent conductive oxide (TCO), said layer based on an electron transport material ("Hole Transport Layer"—HTL), said layer based on an electron transport material ("Electron Transport Layer"—ETL), said wettability enhancing material layer, said layer based on a hole blocking material ("Hole Blocking Layer"—HBL) and said metallic contact known as "back contact" are selected from those set forth above.

For the purpose of the aforementioned process, said mixture comprising perovskite precursors and at least one inert polymer based on cellulose or starch comprises:

at least one halide selected from the halides of the above reported monovalent organic cations or monovalent inorganic cations, preferably iodides, chlorides, bromides, more preferably iodides [for example, methyl-ammonium iodide (MAI) ($CH_3NH_3O$)], and at least one halide selected from the halides of the above reported bivalent metal cations, preferably iodides, chlorides, bromides, more preferably iodides [for example, lead iodide ($PbI_2$)] as perovskite precursors;

at least one inert polysaccharide-based polymer selected from those reported above, preferably 2-hydroxy-ethyl cellulose (HEC).

For the purpose of the aforesaid process, said steps (b), (c), (e), (f) and (g), may be conducted according to deposition techniques known in the art such as, for example, spin-coating, spray-coating, ink-jet printing, slot die coating, gravure printing, screen printing.

For the purpose of the aforesaid process, said step (h) may be conducted according to techniques known in the art such as, for example, evaporation, cathodic sputtering, electron beam assisted deposition, sputtering, spin coating, gravure printing, flexographic printing, slot die coating.

As mentioned above, said semi-transparent perovskite-based photovoltaic cell (or solar cell) can be advantageously used in various applications that require the production of electricity through the exploitation of light energy, in particular solar radiation energy such as, for example: building integrated photovoltaic (BIPV) systems; photovoltaic windows; greenhouses; photo-bioreactors; noise barriers; lighting; design; advertising; automotive industry. Furthermore, said semi-transparent perovskite-based photovoltaic cell (or solar cell) can be used either in a "stand alone" mode or in modular systems.

Accordingly, the present disclosure provides the use of said semi-transparent perovskite-based photovoltaic cell (or solar cell) in: architecturally integrated photovoltaic ("Building Integrated Photo Voltaic"—BIPV) systems; photovoltaic windows; greenhouses; photo-bioreactors; noise barriers; lighting; design; advertising; and the automotive industry.

BRIEF DESCRIPTION OF THE DRAWINGS

The present disclosure will now be illustrated in greater detail through an embodiment with reference to FIG. 1 reported below.

DETAILED DESCRIPTION OF THE DRAWINGS

Figure 1:
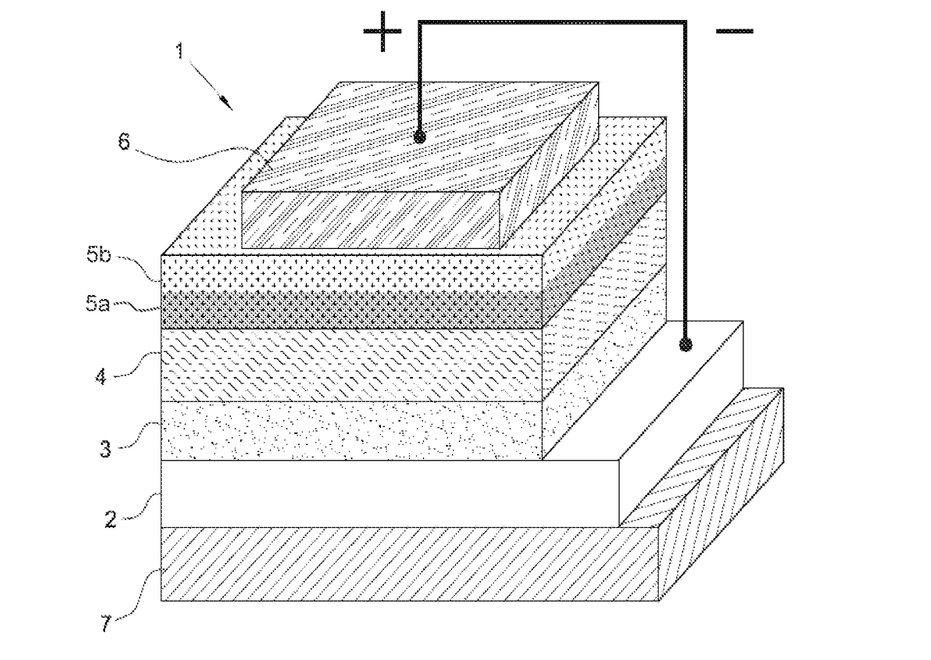

In particular, FIG. 1 depicts a cross-sectional view of a semi-transparent perovskite-based photovoltaic cell (or solar cell) (1) comprising the following layers: a glass substrate (7) covered with a transparent, conductive oxide (TCO) layer (anode) [e.g., indium tin oxide ("Indium Tin Oxide"—ITO) or fluorine-doped tin oxide ($SnO_2$:F) ("Fluorine-doped Tin Oxide"—FTO)] (2); a layer based on a hole transport material ("Hole Transport Layer"—HTL) (e.g., poly[bis(4-phenyl(2,4,6-trimethylphenyl)amine (PTAA), poly[bis(4-butylphenyl)-bisphenylbenzidine] (Poly-TPD), or a mixture of poly(3,4-ethylenedioxythiophene and polystyrene sulfonate (PEDOT:PSS) (3); optionally a layer based on a wettability enhancing material, [e.g., poly(9,9-bis(3'-(N,N-dimethyl)-N-ethylammonium-propyl-2,7fluorene)-alt-2,7-(9,9-dioctylfluorene))-dibromide (PFN-Br)] (not shown in FIG. 1); a photoactive layer comprising at least one perovskite [e.g., methylammonium lead iodide ($CH_3NH_3PbI_3$) and at least one polysaccharide-based inert polymer [e.g., 2-hydroxyethyl cellulose (HEC)] (4); a layer based on an electron transport material ["Electron Transport Layer" (ETL)] [e.g., methyl ester of the [6,6]-phenyl-$C_{61}$-butyric acid ($PC_{61}BM$)] (5a); a layer based on a hole blocking material "Hole Blocking Layer" (HBL) [e.g., 2,9-dimethyl-4,7-diphenyl-1,10-phenanthroline (Batocuproin—BCP) or polyethyleneimine ethoxylate (PEIE)] (5b); a metallic contact known as a "back contact" which constitutes the cathode [e.g., a gold, silver, or metallic aluminium layer] (6).

In order to better understand the present disclosure and to put it into practice, some illustrative and non-limiting examples thereof are reported below.

In the following examples, for the sake of simplicity, the term "solar cell" is used, which is to be intended to have the same meaning as "photovoltaic cell".

EXAMPLE 1

Preparation of a Semi-Transparent Perovskite-Based Photovoltaic Cell

For this purpose, a perovskite-based solar cell was prepared on a glass substrate coated with ITO [Indium Tin Oxide (Kintec KT18086-1)] and patterned (dimensions 15×15×1 mm; sheet resistance equal to 12 $\Omega/cm^2$) and previously subjected to a cleaning process consisting of manual cleaning by wiping with a lint-free cloth soaked in a detergent diluted with deionized water. The substrate was then rinsed with deionized water. Subsequently, the substrate was thoroughly cleaned using the following methods in sequence: ultrasonic baths in (i) deionized water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was placed in a beaker containing the solvent, placed in an ultrasonic bath, kept at 40° C., for a treatment of 10 minutes. After treatments (iii) and (iv), the substrate was dried with a compressed nitrogen flow.

Subsequently, the glass/ITO was further cleaned by treatment in an ozone device (UV Ozone Cleaning System EXPO3—Astel), immediately before proceeding to the next step.

The substrate thus treated was ready for the deposition of the layer based on a hole transport material ("Hole Transport Layer"—HTL). For this purpose, a solution of poly[bis(4-phenyl)(2,4,6-trimethyl)amine (PTTA) (Aldrich) in toluene (99.5% purity—Aldrich) at a concentration equal to 1.5 mg/ml, was deposited by spin coating, operating at a rotation speed equal to 6000 rpm (acceleration equal to 500 rpm/s), for 30 seconds: the whole was subjected to heat treatment (annealing), at 100° C., for 10 minutes. The thickness of the layer based on a hole transport material ("Hole Transport Layer"—HTL) was found to be equal to 40 nm.

The substrate thus obtained was placed in a dry box and the layer of methylammonium lead iodide ($CH_3NH_3PbI_3$) and 2-hydroxyethyl cellulose (HEC) was deposited on the layer based on a hole transport material ("Hole Transport Layer"—HTL), operating as follows. For this purpose, lead iodide ($PbI_2$) (purity 99.9985%—Alfa Aesar) (305.5 mg-0.66 mmoles), methylammonium iodide (MAI) ($CH_3NH_3I$) (GreatCell Solar) (104.3 mg-0.66 mmoles) and 2-hydroxyethyl cellulose (HEC) (weight average molecular weight ($M_w$)=250000) (Aldrich) (10.2 mg), previously dried in an oven, for 5 days, so that the water content is less than 2% by weight, were dissolved in anhydrous dimethyl sulfoxide (purity 99.9%—Aldrich) (1 ml), while stirring at a temperature of 80° C., for 3 hours, obtaining a solution containing 27% by weight of perovskite precursors and 0.66% by weight of 2-hydroxyethyl cellulose (HEC), i.e. 2.5% by weight of 2-hydroxyethyl cellulose (HEC) with respect to the total weight of the other solid components (i.e. lead ($PbI_2$)+methylammonium iodide (MAI) ($CH_3NH_3I$). The solution thus obtained has been deposited on said layer based on a hole transport material ("Hole Transport Layer"—HTL), by spin coating operating at a rotation speed equal to 12000 rpm (acceleration equal to 1000 rpm/s), for 60 seconds and the whole has been subjected to heat treatment (annealing), at 100° C., for 60 minutes. The thickness of the perovskite and 2-hydroxyethyl cellulose (HEC) layer was found to be equal to 170 nm.

The substrate thus obtained was ready for the deposition of the layer based on an electron transport material ("Electron Transport Layer"—ETL). For this purpose, a filtered solution of methyl ester of [6,6]-phenyl-$C_{61}$-butyric acid ($PC_{61}BM$) (Nano-C Products) (25 mg) in anhydrous chlorobenzene (purity 99.8%—Aldrich) (1 ml), was deposited, by spin coating operating at a rotation speed equal to 1000 rpm (acceleration equal to 500 rpm/s), for 60 seconds: the substrate obtained was allowed to rest, at room temperature (25° C.), for 5 minutes. The thickness of the layer based on an electron transport material ("Electron Transport Layer"—HTL) was found to be equal to 50 nm.

The substrate thus obtained was ready for the deposition of a layer based on a hole blocking material ("Hole Blocking Layer"—HBL). For this purpose, a solution of 2,9-dimethyl-4,7-diphenyl-1,10-phenatroline (Batocuproin—BCP) (purity 96%—Aldrich) (5 mg) in anhydrous iso-propyl alcohol (purity 99.5%-Aldrich) (10 ml) obtained by operating under stirring at 80° C., for 3 hours, was deposited, by spin coating operating at a rotation speed equal to 6000 rpm (acceleration equal to 1000 rpm/s), for 20 seconds: the substrate obtained was allowed to rest, at room temperature (25° C.), for 5 minutes. The thickness of the layer based on a hole blocking material ("Hole Blocking Layer"—HBL) was found to be equal to 5 nm.

Subsequently, gold (Au) "back contact" (cathode) was deposited on said layer based on a hole blocking material ("Hole Blocking Layer"—HBL) by evaporation. For this purpose, a Kurt J. Lesker evaporator was used, operating at a pressure equal to $2 \times 10^{-6}$ mmHg and a speed equal to 0.2 Angstrom/sec, suitably masking the area of the solar cell so as to obtain an active area equal to 4 $mm^2$. The thickness of the gold (Au) "back contact" (cathode) was found to be equal to 10 nm.

Thicknesses were measured by scanning electron microscopy using a Jeol 7600f Scanning Electron Microscope (SEM), equipped with a field emission electron gun, operating at an accelerating voltage ranging between 1 kV and 5 kV, and exploiting the signal from secondary electrons.

The electrical characterization of the obtained semi-transparent perovskite-based solar cell was carried out at room temperature (25° C.). The current-voltage density (J-V) curves were acquired with a Keithley® 2400 sourcemeter connected to a personal computer for data collection. The photocurrent was measured by exposing the solar cell to the light of a Newport 91160A solar simulator (Newport Corp), placed at a distance of 10 mm from said semi-transparent solar cell, equipped with a 300 W Xenon light source, using an illumination spot equal to 100 mm×100 mm: Table 1 shows the characteristic parameters as average values.

The light intensity was calibrated with a standard silicon solar cell ("VLSI Standard"—SRC-100-RTD-KG5).

In addition, said semi-transparent perovskite-based solar cell was subjected to the measurement of transparency in the visible region ["Average Visible Transmittance"—(AVT)] (i.e. AVT>20%), measured in the range between 400 nm and 800 nm, using a UV-vis spectrophotometer (VarianAU/DN^MS-100s): the measurement was carried out both on the complete semi-transparent solar cell based on perovskite, and on the semi-transparent perovskite-based photovoltaic cell before the deposition of the gold (Au) back contact (cathode): Table 1 reports the results obtained as average values.

In particular, Table 1 reports, in order: the number of the Reference Example; the composition of the photoactive layer based on perovskite and 2-hydroxyethylcellulose; FF ("Fill Factor"); Voc ("Open Circuit Voltage"); Jsc ("short-circuit photocurrent density"); PCE ("Power Conversion Efficiency"); AVT ("Average Visible Transmittance") (complete solar cell and solar cell without gold cathode).

EXAMPLE 2

Preparation of a Semi-Transparent Perovskite-Based Photovoltaic Cell

The semi-transparent perovskite-based solar cell was obtained using the same process as reported in Example 1, with the only difference resulting from the use of perovskite precursors and 2-hydroxyethyl cellulose (HEC) in different concentrations.

For this purpose, lead iodide ($PbI_2$) (purity 99.9985%—Alfa Aesar) (272.6 mg-0.59 mmoles), methylammonium iodide (MAI) ($CH_3NH_3I$) (GreatCell Solar) (94 mg-0.66 mmoles) and 2-hydroxyethyl cellulose (HEC) (weight average molecular weight ($M_W$)=250000) (Aldrich) (9.2 mg), previously dried in an oven, for 5 days, so that the water content is less than 2% by weight, were dissolved in anhydrous dimethyl sulfoxide (purity 99.9%—Aldrich) (1 ml), while stirring at a temperature of 80° C., for 3 hours, obtaining a solution containing 25% by weight of perovskite precursors and 0.62% by weight of 2-hydroxyethyl cellulose (HEC), i.e. 2.5% by weight of 2-hydroxyethyl cellulose (HEC) with respect to the total weight of the other solid components (i.e. lead ($PbI_2$)+methylammonium iodide (MAI) ($CH_3NH_3I$). The solution thus obtained has been deposited on said layer based on a hole transport material ("Hole Transport Layer"—HTL), by spin coating operating at a rotation speed equal to 12000 rpm (acceleration equal to 1000 rpm/s), for 60 seconds and the whole has been subjected to heat treatment (annealing), at 100° C., for 60 minutes. The thickness of the perovskite and 2-hydroxyethyl cellulose (HEC) layer was found to be equal to 120 nm.

The electrical characterization of the obtained semi-transparent perovskite-based solar cell was carried out as described above: Table 1 reports the characteristic parameters as average values.

EXAMPLE 3

Preparation of a Semi-Transparent Perovskite-Based Photovoltaic Cell

The semi-transparent perovskite-based solar cell was obtained using the same process as reported in Example 1, with the only difference resulting from the use of perovskite precursors and 2-hydroxyethyl cellulose (HEC) in different concentrations.

For this purpose, lead iodide ($PbI_2$) (purity 99.9985%—Alfa Aesar) (204.5 mg-0.44 mmoles), methylammonium iodide (MAI) ($CH_3NH_3I$) (GreatCell Solar) (70.5 mg-0.44 mmoles) and 2-hydroxyethyl cellulose (HEC) (weight average molecular weight ($M_W$)=250000) (Aldrich) (6.9 mg), previously dried in an oven, for 5 days, so that the water content is less than 2% by weight, were dissolved in anhydrous dimethyl sulfoxide (purity 99.9%—Aldrich) (1 ml), while stirring at a temperature of 80° C., for 3 hours, obtaining a solution containing 20% by weight of perovskite precursors and 0.5% by weight of 2-hydroxyethyl cellulose (HEC), i.e. 2.5% by weight of 2-hydroxyethyl cellulose (HEC) with respect to the total weight of the other solid components (i.e. lead ($PbI_2$)+methylammonium iodide (MAI) ($CH_3NH_3I$). The solution thus obtained has been deposited on said layer based on a hole transport material ("Hole Transport Layer"—HTL), by spin coating operating at a rotation speed equal to 12000 rpm (acceleration equal to 1000 rpm/s), for 60 seconds and the whole has been subjected to heat treatment (annealing), at 100° C., for 60 minutes. The thickness of the perovskite and 2-hydroxyethyl cellulose (HEC) layer was found to be equal to 80 nm.

The electrical characterization of the obtained semi-transparent solar cell was carried out as described above: Table 1 reports the characteristic parameters as average values.

EXAMPLE 4 (COMPARATIVE)

Preparation of a Semi-Transparent Perovskite-Based Photovoltaic Cell

The semi-transparent perovskite-based solar cell was obtained using the same process as reported in Example 1, with the only difference resulting from the use of cellulose acetate (CAc) instead of 2-hydroxyethyl cellulose (HEC) and of perovskite precursors in different concentrations.

For this purpose, lead iodide ($PbI_2$) (purity 99.9985%—Alfa Aesar) (350.5 mg-0.75 mmoles), methylammonium iodide (MAI) ($CH_3NH_3I$) (GreatCell Solar) (120.8 mg-0.75 mmoles) and cellulose acetate (CAc) (weight average molecular weight ($M_W$)=50000) (Aldrich) (11.8 mg), previously dried in an oven, for 5 days, so that the water content is less than 2% by weight, were dissolved in anhydrous dimethyl sulfoxide (purity 99.9%—Aldrich) (1 ml), while stirring at a temperature of 80° C., for 3 hours, obtaining a solution containing 30% by weight of perovskite precursors and 0.74% by weight of cellulose acetate (CAc), i.e. 2.5% by weight of cellulose acetate (CAc) with respect to the total weight of the other solid components (i.e. lead ($PbI_2$)+methylammonium iodide (MAI) ($CH_3NH_3I$). The solution thus obtained has been deposited on said layer based on a hole transport material ("Hole Transport Layer"—HTL), by spin coating operating at a rotation speed equal to 12000 rpm (acceleration equal to 1000 rpm/s), for 60 seconds and the whole has been subjected to heat treatment (annealing), at 100° C., for 60 minutes. The thickness of the perovskite and cellulose acetate (CAc) layer was found to be equal to 250 nm.

The electrical characterization of the obtained semi-transparent solar cell was carried out as described above: Table 1 reports the characteristic parameters as average values.

EXAMPLE 5 (COMPARATIVE)

Preparation of a Semi-Transparent Perovskite-Based Photovoltaic Cell

The semi-transparent perovskite-based solar cell was obtained using the same process as reported in Example 1, with the only difference resulting from the use of hydroxypropyl cellulose (HPC) instead of 2-hydroxyethyl cellulose (HEC) and of perovskite precursors in different concentrations.

For this purpose, lead iodide ($PbI_2$) (purity 99.9985%—Alfa Aesar) (272.6 mg-0.59 mmoles), methylammonium iodide (MAI) ($CH_3NH_3I$) (GreatCell Solar) (94.0 mg-0.59 mmoles) and hydroxypropyl cellulose (HPC) (weight average molecular weight ($M_W$)=80000) (Aldrich) (4.0 mg), previously dried in an oven, for 5 days, so that the water content is less than 2% by weight, were dissolved in anhydrous dimethyl sulfoxide (purity 99.9%—Aldrich) (1 ml), while stirring at a temperature of 80° C., for 3 hours: it was not possible to obtain an homogeneous solution and, consequently, to made the semi-transparent perovskite-based solar cell.

TABLE 1

| Example | Photoactive layer (thickness - nm) | FF[1] (%) | Voc[2] (V) | Jsc[3] (mA/cm$^2$) | PCE[4] (%) | AVT[5a] (%) | AVT[5b] (%) |
|---|---|---|---|---|---|---|---|
| 1 | MAPI (27)[6] + HEC (2.5)[7] (170) | 67.5 | 1.02 | 17.3 | 12.0 | 21 | 36 |
| 2 | MAPI (25)[6] + HEC (2.5)[7] (120) | 72.0 | 1.06 | 15.0 | 11.4 | 22 | 39 |
| 3 | MAPI (20)[6] + HEC (2.5)[7] (80) | 66.5 | 1.02 | 10.9 | 7.4 | 25 | 47 |
| 4 (comparative) | MAPI (30)[6] + CAc (2.5)[8] (250) | 50.7 | 0.44 | 1.7 | 0.4 | — | — |

[1]"Fill Factor";
[2]"Open Circuit Voltage";
[3]"short-circuit photocurrent density";
[4]"Power Conversion Efficiency";
[5a]"Average Visible Transmittance" (complete semi-transparent solar cell based on perovskite);
[5b]"Average Visible Transmittance" (semi-transparent perovskite-based solar cell without gold cathode);
[6]methylammonium lead iodide [(CH$_3$NH$_3$)PbI$_3$] [(in brackets % by weight of perovskite precursors (i.e. lead (PbI$_2$) + methylammonium iodide (MAI) (CH$_3$NH$_3$I)];
[7]2-Hydroxyethyl cellulose (HEC) (in brackets, % by weight of 2-hydroxyethyl cellulose (HEC) with respect to the total weight of the other solid components (i.e., lead (PbI$_2$) + methylammonium iodide (MAI) (CH$_3$NH$_3$I)];
[8]cellulose acetate (CAc) (in brackets, % by weight of cellulose acetate (CAc) with respect to the total weight of the other solid components (i.e., lead (PbI$_2$) + methylammonium iodide (MAI) (CH$_3$NH$_3$I)].

From the data shown in Table 1, it can be seen that the semi-transparent perovskite-based solar cell object of the present disclosure (Example 1-3) has both good power conversion efficiency (PCE) (i.e. PCE>10%), and a good transparency in the visible region ["Average Visible Transmittance"—(AVT)] (i.e. AVT>20%) (measured in the range between 400 nm and 800 nm, this result being obtained without negatively affecting the remaining electrical properties, i.e. the values of FF ("Fill Factor"), Voc ("Open Circuit Voltage"); Jsc ("short-circuit photocurrent density"). On the contrary, the semi-transparent perovskite-based solar cell of Example 4 (comparative) has a very low power conversion efficiency (PCE) (i.e. PCE=0.4%), and poor electrical properties, i.e. the values of FF ("Fill Factor"), Voc ("Open Circuit Voltage"); Jsc ("short-circuit photocurrent density").

The invention claimed is:

1. A semi-transparent perovskite-based photovoltaic cell, comprising a photoactive perovskite layer formed from perovskite precursors, wherein the photoactive perovskite layer comprises at least one polysaccharide-based inert polymer in an amount ranging between 1.5% by weight and 2.8% by weight, with respect to the total weight of the perovskite precursors, said polysaccharide-based inert polymer being selected from methylcellulose, 2-hydroxyethyl cellulose (HEC), methyl-2-hydroxyethyl cellulose, hydroxypropyl methyl cellulose, cellulose acetate phthalate, cellulose propionate, corn starch, potato starch, rice starch, 2-hydroxyethyl starch, carboxymethyl starch, glycogen.

2. The semi-transparent perovskite-based photovoltaic cell according to claim 1, wherein said perovskite is selected from organometallic trihalides having general formula ABX$_3$, wherein:
A represents a monovalent organic cation such as methylammonium (CH$_3$NH$_3^+$), formamidinium [CH(NH$_2$)$_2^+$], n-butylammonium (C$_4$H$_{12}$NH$_3^+$), tetra-butylammonium (C$_{16}$H$_{36}$N$^+$), or mixtures thereof; or A represents a monovalent inorganic cation such as caesium (Cs$^+$), rubidium (Rb$^+$), potassium (K$^+$), lithium (Li$^+$), sodium (Na$^+$), copper (Cu$^+$), silver (Ag$^+$), or mixtures thereof; or mixtures thereof;
B represents a divalent metallic cation such as lead (Pb$^{2+}$), tin (Sn$^{2+}$), or mixtures thereof; and
X represents a halide anion such as iodine (I), chlorine (Cl$^-$), bromine (Br$^-$), or mixtures thereof.

3. The semi-transparent perovskite-based photovoltaic cell according to claim 1, wherein said perovskite is selected from: methylammonium lead iodide (CH$_3$NH$_3$PbI$_3$), methylammonium lead bromide (CH$_3$NH$_3$PbBr$_3$), methylammonium lead chloride (CH$_3$NH$_3$PbCl$_3$), methylammonium lead iodide bromide (CH$_3$NH$_3$PbI$_x$Br$_{3-x}$), methylammonium lead iodide chloride (CH$_3$NH$_3$PbI$_x$Cl$_{3-x}$), formamidinium lead iodide [CH(NH$_2$)$_2$PbI$_3$], formamidinium lead bromide [CH(NH$_2$)$_2$PbBr$_3$], formamidinium lead chloride [CH(NH$_2$)$_2$PbCl$_3$], formamidinium lead iodide bromide [CH(NH$_2$)$_2$PbI$_x$Br$_{3-x}$], formamidinium lead iodide chloride [CH(NH$_2$)$_2$PbI$_x$Cl$_{3-x}$], methylammonium formamidinium lead iodide [(CH$_3$NH$_3$)$_x$(CH(NH$_2$)$_2$)$_{1-x}$PbI$_3$], methylammonium formamidinium lead bromide [(CH$_3$NH$_3$)$_x$(CH(NH$_2$)$_2$)$_{1-x}$PbBr$_3$], methylammonium formamidinium lead chloride [(CH$_3$NH$_3$)$_x$(CH(NH$_2$)$_2$)$_{1-x}$PbCl$_3$], methylammonium formamidinium lead iodide chloride [(CH$_3$NH$_3$)$_x$(CH(NH$_2$)$_2$)$_{1-x}$PbI$_{3-y}$Cl$_y$], methylammonium formamidinium lead iodide bromide [(CH$_3$NH$_3$)$_x$(CH(NH$_2$)$_2$)$_{1-x}$PbI$_{3-y}$Br$_y$], n-butylammonium lead iodide (C$_4$H$_{12}$NH$_3$PbI$_3$), tetra-butylammonium lead iodide (C$_{16}$H$_{36}$NPbI$_3$), n-butylammonium lead bromide (C$_4$H$_{12}$NH$_3$PbBr$_3$), tetra-butylammonium lead bromide (C$_{16}$H$_{36}$NPbBr$_3$), caesium lead iodide (CsPbI$_3$), rubidium lead iodide (RbPbI$_3$), potassium lead iodide (KPbI$_3$), caesium methylammonium lead iodide [Cs$_x$(CH$_3$NH$_3$)$_{1-x}$PbI$_3$], potassium methylammonium lead iodide [K$_x$(CH$_3$NH$_3$)$_{1-x}$PbI$_3$], caesium methylammonium lead iodide chloride [Cs$_x$(CH$_3$NH$_3$)$_{1-x}$PbI$_{3-y}$Cl$_y$], caesium formamidinium lead iodide [Cs$_x$(CH(NH$_2$)$_2$)$_{1-xPbI3}$], caesium formamidinium lead bromide [Cs$_x$(CH(NH$_2$)$_2$)$_{1-x}$PbBr$_3$], caesium formamidinium lead iodide chloride [Cs$_x$(CH(NH$_2$)$_2$)$_{1-x}$PbI$_{3-y}$Cl$_y$], methylammonium tin iodide (CH$_3$NH$_3$SnI$_3$), methylammonium tin bromide (CH$_3$NH$_3$SnBr$_3$), methylammonium tin iodide bromide (CH$_3$NH$_3$SnI$_x$Br$_{3-x}$), formamidinium tin iodide [CH(NH$_2$)$_2$SnI$_3$], formamidinium tin iodide bromide [CH(NH$_2$)$_2$SnI$_x$Br$_{3-x}$], n-butylammonium tin iodide (C$_4$H$_{12}$NH$_3$SnI$_3$), tetra-butylammonium tin iodide (C$_{16}$H$_{36}$NSnI$_3$), n-butylammonium tin bromide (C$_4$H$_{12}$NH$_3$SnBr$_3$), tetra-butylammonium tin bromide (C$_{16}$H$_{36}$NSnBr$_3$), methylammonium tin lead iodide (CH$_3$NH$_3$Sn$_x$Pb$_{1-x}$I$_3$), formamidinium tin lead iodide [CH(NH$_2$)$_2$Sn$_x$Pb$_{1-x}$I$_3$], or mixtures thereof.

4. The semi-transparent perovskite-based photovoltaic cell according to claim 1, wherein said polysaccharide-based inert polymer is selected from 2-hydroxyethyl cellulose (HEC), cellulose acetate phthalate, corn starch.

5. The semi-transparent perovskite-based photovoltaic cell according to claim 1, comprising:
a glass substrate covered with a layer of transparent and conductive oxide (TCO), which constitutes the anode;

a layer based on a hole transport material ("Hole Transport Layer"-HTL);

optionally, a layer based on a material to improve the wettability;

a layer based on an electron transport material ("Electron Transport Layer"-ETL);

optionally a layer based on a hole blocking material ("Hole Blocking Layer"-HBL); and a metallic contact which constitutes the cathode, wherein the photoactive perovskite layer comprises at least one inert polymer based on cellulose or starch.

6. The semi-transparent perovskite-based photovoltaic cell according to claim 1, wherein the electrical energy generated by said at least one semi-transparent perovskite-based photovoltaic cell is transported using a wiring system which is connected with said semi-transparent perovskite-based photovoltaic cell.

7. A process for preparing a semi-transparent perovskite-based photovoltaic cell comprising the following steps:
   (a) preparing a glass substrate covered with a layer of transparent and conductive oxide (TCO) (anode);
   (b) depositing a layer based on a hole transport material ("Hole Transport Layer" - HTL) on the substrate obtained in said step (a);
   (c) optionally, depositing on the layer based on a hole transport material ("Hole Transport Layer"-HTL) obtained in said step (b) a layer based on a material to improve the wettability;
   (d) preparing a mixture comprising perovskite precursors and at least one inert polymer based on cellulose or starch, said inert polymer being used in an amount ranging between 1.5% by weight and 2.8% by weight, with respect to the total weight of the perovskite precursors;
   (e) depositing the mixture obtained in said step (d) on the layer based on a hole transport material ("Hole Transport Layer"-HTL) obtained in said step (b), or on the layer based on a material to improve the wettability obtained in said step (c), obtaining a photoactive layer;
   (f) depositing a layer based on an electron transport material ("Electron Transport Layer"-ETL), on the photoactive layer obtained in said step (e);
   (g) optionally, depositing on the layer based on an electron transport material ("Electron Transport Layer"-ETL) obtained in said step (g), a layer based on a hole blocking material ("Hole Blocking Layer"-HBL); and
   (h) depositing a metallic contact which constitutes the cathode, on the layer based on an electron transport material ("Electron Transport Layer"-ETL) obtained in said step (f), or on the layer based on a hole blocking material ("Hole Blocking Layer"-HBL) obtained in said step (g);
   wherein said steps (b), (c), (e), (f) and (g), are carried out at a temperature lower than 120° C.

8. An article comprising the semi-transparent perovskite-based photovoltaic cell according to claim 1, wherein the article comprises: an architecturally integrated photovoltaic system ("Building Integrated Photo Voltaic" - BIPV); a photovoltaic window; a greenhouse; a photo-bioreactor; a noise barrier;

a lighting; a design; an advertising; or an automobile.

* * * * *